United States Patent
Emira et al.

(10) Patent No.: US 10,629,755 B1
(45) Date of Patent: Apr. 21, 2020

(54) STAGGERED-BIAS VARACTOR

(71) Applicant: SHENZHEN GOODIX TECHNOLOGY CO., LTD., Shenzhen (CN)

(72) Inventors: Ahmed Emira, San Diego, CA (US); Faisal Hussein, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/214,037

(22) Filed: Dec. 8, 2018

(51) Int. Cl.
   *H01L 29/93* (2006.01)
   *H03H 7/20* (2006.01)

(52) U.S. Cl.
   CPC ............... *H01L 29/93* (2013.01); *H03H 7/20* (2013.01)

(58) Field of Classification Search
   CPC .................................. H01L 29/93; H03H 7/20
   USPC .................................................. 327/554, 581
   See application file for complete search history.

(56) References Cited

U.S. PATENT DOCUMENTS

| 2008/0111642 | A1 | 5/2008 | Bohorquez |
| 2015/0109072 | A1* | 4/2015 | Bakalski ............. H03J 3/20 333/174 |
| 2016/0072463 | A1 | 10/2016 | Camilleri |

FOREIGN PATENT DOCUMENTS

| CN | 104796139 A | 7/2015 |
| CN | 205566222 U | 9/2016 |
| CN | 106992780 A | 7/2017 |
| CN | 108352810 A | 7/2018 |
| JP | 2003174320 A | 6/2003 |

OTHER PUBLICATIONS

Meicheng Xu, LC voltage controlled oscillator, Sep. 7, 2016, English Machine Translation of CN205566222 (Year: 2016).*
International Search Report dated Sep. 10, 2019 in the corresponding PCT application (PCT/CN2019/090213).
EP Search Report dated Feb. 14, 2020 in the corresponding EP application (application No. 19755515.4).
Wu Ya-Pei et al: "Design and analysis of a 3.85-5.23 GHz linear-tuning CMOS LC-tank VCO", 2018 7th International Symposium on Next Generation Electronics (ISNE), IEEE, May 7, 2018 (May 7, 2018), pp. 1-4, XP033363486, DOI: 10.1109/ISNE.2018.8394650 [retrieved on Jun. 22, 2018], p. 1-p. 2; figures 1-3.

* cited by examiner

*Primary Examiner* — John W Poos
(74) *Attorney, Agent, or Firm* — Kilpatrick Townsend & Stockton LLP

(57) ABSTRACT

Techniques are described for staggered-bias varactors. For example, a staggered-bias varactor can include a control voltage node, a number of bias voltage nodes, and a number of sub-varactors coupled in parallel. The control voltage node can be configured to receive a single, variable control voltage; and the bias voltage nodes can each be configured to receive a different, fixed bias voltage. Each sub-varactor is configured, so that its equivalent capacitance is a function of a difference between the control voltage and a respective one of the bias voltages; and the equivalent capacitance of the staggered-bias varactor is a function of the capacitances of the component sub-varactors. The number of varactors and the bias voltages can be configured, so that respective non-linear capacitive responses of the component sub-varactors effectively combine to yield a substantially linear capacitive response for the staggered-bias varactor as a whole.

15 Claims, 6 Drawing Sheets

STAGGERED-BIAS VARACTOR

FIELD OF THE INVENTION

The present invention relates generally to varactor circuits. More particularly, embodiments of the present invention relate to varactor circuits using staggered bias voltage inputs to enable a substantially linear total capacitance response over a range of control voltages.

BACKGROUND OF THE INVENTION

Various types of electronic applications can include clock circuits, or the like, which can include voltage-controlled oscillators. Many such oscillators can be responsive to a variable capacitance. For example, varying a capacitance in an inductive-capacitive (LC) oscillator can impact a resonant frequency of the LC oscillator; and varying a capacitance in a ring oscillator can impact a ring delay of the ring oscillator. Conventionally, the variable capacitors in such applications tend to manifest non-linear changes in capacitance over different regions of their operating range. For example, at some operating regions, a small magnitude of control adjustment can manifest a relatively small magnitude change in capacitance; while at other operating regions, the same magnitude of control adjustment can manifest a relatively large magnitude change in capacitance. Such a non-linear response can be undesirable in many applications.

BRIEF SUMMARY OF THE INVENTION

Embodiments provide circuits, devices, and methods for staggered-bias varactors. For example, a staggered-bias varactor can include a control voltage node, a number of bias voltage nodes, and a number of sub-varactors coupled in parallel. The control voltage node can be configured to receive a single, variable control voltage; and the bias voltage nodes can each be configured to receive a different, fixed bias voltage. Each sub-varactor can include a variable capacitance portion that is coupled with the control voltage node and a respective one of the bias voltage nodes, so that the an equivalent capacitance of each sub-varactor is a function of a difference between the control voltage and the respective bias voltage; and the equivalent capacitance of the staggered-bias varactor is a function of the capacitances of the component sub-varactors. The number of varactors and the bias voltages can be configured, so that respective non-linear capacitive responses of the component sub-varactors effectively combine to yield a substantially linear capacitive response for the staggered-bias varactor as a whole.

According to one set of embodiments, an oscillator system is provided. The system includes: a capacitor-controlled oscillator to generate an output signal at an oscillator frequency; and a varactor having varactor terminals coupled with the capacitor-controlled oscillator. The varactor includes: a control voltage node; N bias voltage input nodes, wherein N is a positive integer greater than one; and N sub-varactors, each coupled between the varactor terminals, and having a variable capacitance portion coupled with the control voltage node and with a respective one of the N bias voltage nodes, such that a respective sub-varactor capacitance of each sub-varactor varies as a function of a control voltage applied at the control voltage node and a respective bias voltage applied at the respective one of the N bias voltage nodes, and such that the oscillator frequency is a function of a total capacitance of the N respective sub-varactor capacitances in parallel.

According to another set of embodiments, a staggered-bias varactor is provided. The staggered-bias varactor includes: a pair of varactor terminals; a control voltage node; N bias voltage input nodes, wherein N is a positive integer greater than one; and N sub-varactors, each coupled between the pair of varactor terminals, and having a variable capacitance portion coupled with the control voltage node and with a respective one of the N bias voltage nodes, such that a respective sub-varactor capacitance of each sub-varactor varies as a function of a control voltage applied at the control voltage node and a respective bias voltage applied at the respective one of the N bias voltage nodes.

According to another set of embodiments, a method is provided for controlling a total capacitance across varactor terminals of a staggered-bias varactor. The method includes: applying a respective one of N different fixed bias voltage level at each of N bias voltage input nodes of the staggered-bias varactor, wherein N is a positive integer greater than one; and varying a control voltage level applied at a control voltage node, wherein the staggered-bias varactor comprises N sub-varactors, each coupled between the varactor terminals, and each having a variable capacitance portion coupled with the control voltage node and with a respective one of the N bias voltage nodes, such that a respective sub-varactor capacitance of each sub-varactor varies in response to varying the control voltage level.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
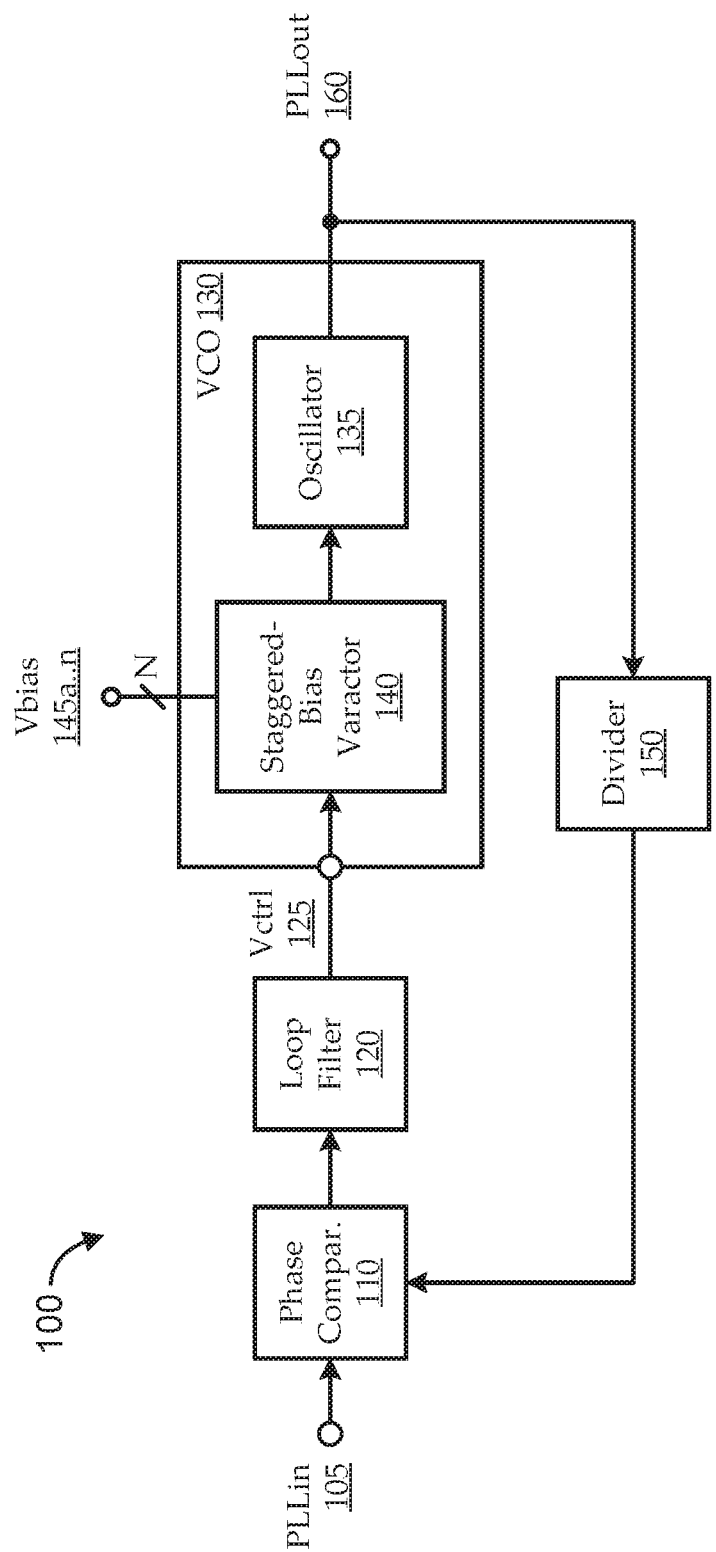
FIG. 1 shows an illustrative phase-locked-loop (PLL) system, as context for various embodiments.

FIG. 1 shows an illustrative phase-locked-loop (PLL) system 100, as context for various embodiments. The PLL system 100 generates a PLL output signal (PLLout) 160 in accordance with a received PLL input signal (PLLin) 105. For example, PLLin 105 can be a clock reference signal generated by a crystal oscillator, or the like, at a particular input frequency. The PLL system 100 uses a feedback loop to generate PLLout 160 in such a way that PLLout 160 is locked to a desired output frequency (e.g., typically a multiple of the input frequency of PLLin 105).

As illustrated, the PLL system 100 includes a phase comparison block 110, a loop filter block 120, a voltage controlled oscillator block 130, and a divider block 150. The phase comparison block 110 can be implemented as a phase/frequency detector (PFD), or any other suitable component, that receives PLLin 105 and compares PLLin 105 with a signal fed back by the feedback loop of the PLL system 100. The output of the phase comparison block 110 is a function of the comparison and is fed to the loop filter block 120. The loop filter block 120 can include any suitable components for facilitating filtering over the feedback loop, such as a charge pump and a low-pass filter. The output of the loop filter block 120 can be used as a control voltage (Vctrl) 125 for controlling the VCO block 130. Embodiments of the VCO block 130 operate to generate PLLout 160 at an output frequency that is controlled at least partially by Vctrl 125. The output of the VCO block 130 (PLLout 160) is typically a multiple of PLLin 105. Accordingly, prior to feeding the PLLout 160 signal back to the phase comparison block 110, embodiments use the divider block 150 to divide the frequency of the fed back signal down to approximately the input frequency of PLLin 105.

As illustrated, the VCO block 130 can include an oscillator 135 and a staggered-bias varactor 140. The oscillator 135 can be implemented as any suitable oscillator for which its output frequency is controlled at least partially by a variable capacitance. In some implementations, the oscillator 135 is an inductive-capacitive (LC) oscillator. In such implementations, the resonant frequency of the LC oscillator is a function of capacitance, such that varying capacitance can effectively tune the output frequency of the oscillator 135. In other implementations, the oscillator 135 is a ring oscillator. In such implementations, the oscillation frequency is a function of an amount of delay in a ring, and the delay can be a function of capacitance; such that varying capacitance can effectively tune the output frequency of the oscillator 135.

Figure 2:
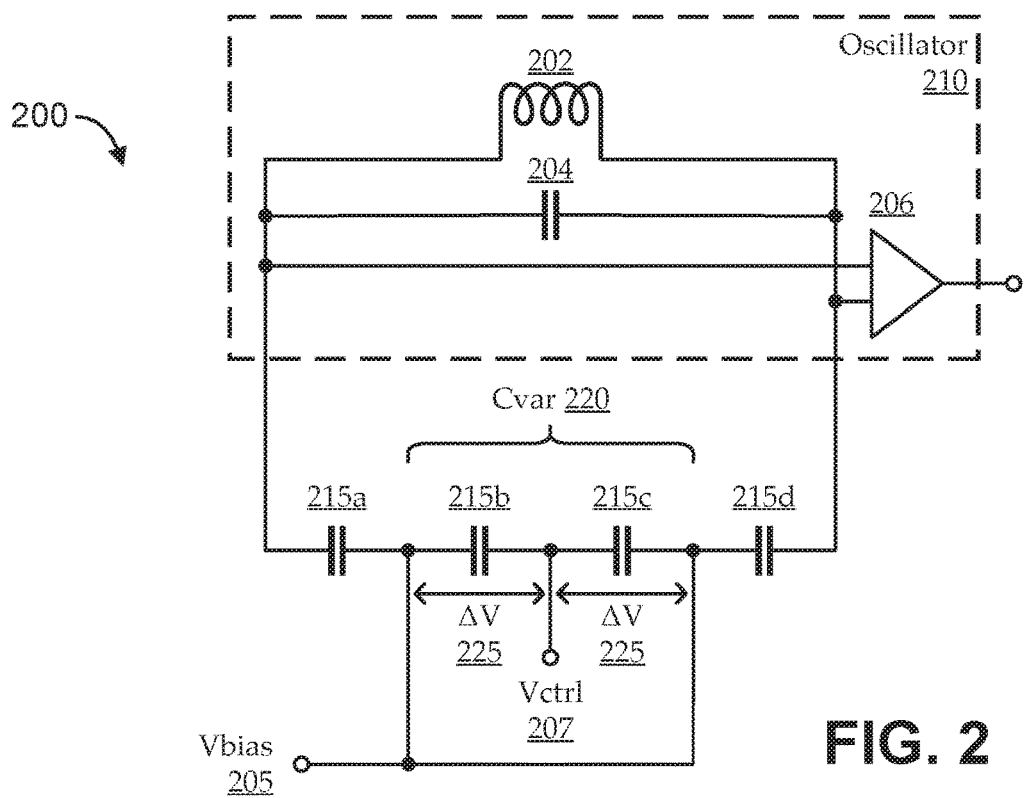
FIG. 2 shows a conventional oscillator circuit coupled with a voltage-controlled capacitance.

For the sake of illustration, FIG. 2 shows a conventional LC oscillator circuit 210 coupled with a voltage-controlled capacitance. The circuits are shown simplified to avoid needlessly complicating the description. For example, additional resistors, capacitors, and/or other components, though not shown, would typically be part of such a circuit. The LC oscillator circuit 210 includes an inductor 202 and a capacitor 204 that are configured as an LC network that resonates at a desired frequency. An amplifier 206 is coupled with the LC network to generate an output signal with desired gain and/or other characteristics.

Though the capacitance of the LC network is primarily set by capacitor 204, the capacitance can be adjusted over a certain range using an additional set of capacitors 215 that can have variable capacitance as a function of a variable control voltage 207 and a fixed bias voltage 205. The set of capacitors 215 can be coupled in parallel with the primary capacitor 204, such that the equivalent capacitance of the LC network is the sum of the capacitance of the primary capacitor 204 and the capacitance of the set of capacitors 215. For example, as illustrated, the set of capacitors 215 can include four capacitors 215, at least two of which (e.g., 215b and 215c) each being coupled between the bias voltage 205 and the control voltage 207. In such a configuration, capacitors 215b and 215c effectively form a parallel capacitor network having an equivalent capacitance indicated as Cvar 220. The voltage across that parallel capacitor network (ie., across each of capacitors 215b and 215c) is the difference between the control voltage 207 and the bias voltage 205 (i.e., $\Delta V$ 225=Vctrl 207−Vbias 205). In such a configuration, Cvar 220 can vary with changes in $\Delta V$ 225.

Figure 3:
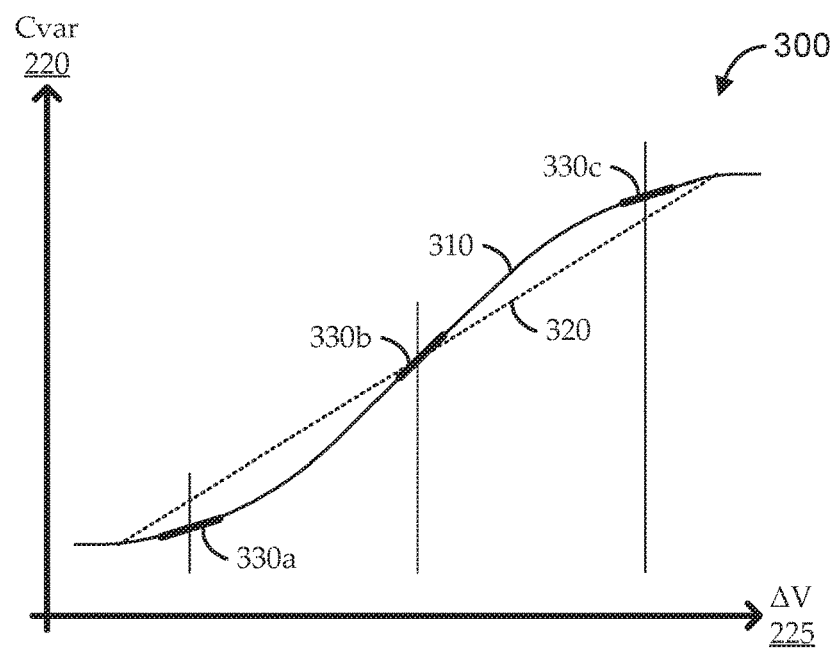
FIG. 3 shows an illustrative plot of capacitive response for the conventional voltage-controlled capacitor configuration of FIG. 2.

FIG. 3 shows an illustrative plot 300 of capacitive response 310 for the conventional voltage-controlled capacitor configuration of FIG. 2. The term "capacitive response" is used herein to refer to a magnitude change in capacitance as a function of a magnitude change in one or more voltages used to adjust the capacitance. For example, capacitive response can be measured as change in capacitance versus change in a control voltage, or change in capacitance versus a relative change between the control voltage and a bias voltage. In FIG. 3, the capacitive response 310 is expressed as Cvar 220 over a range of $\Delta V$ 225. For the sake of reference, the plot 300 includes an illustrative ideal linear response curve 320. However, as shown, the actual capacitive response 310 of the conventional voltage-controlled capacitor is typically non-linear, such that the slope 330 of the capacitive response 310 curve is different at different levels of $\Delta V$ 225. For example, at low and high $\Delta V$ 225 levels, the slope of the capacitive response 310 curve (e.g., slope 330a and 330c) is relatively small; while at medium $\Delta V$ 225 levels, the slope of the capacitive response 310 curve (e.g., slope 330b) is relatively large.

Turning back to FIG. 2, the non-linearity of the capacitive response 310 in FIG. 3 can be expressed as follows: at certain control voltage 207 levels, a particular magnitude change in the control voltage 207 (i.e., causing a particular magnitude change in $\Delta V$ 225) manifests a relatively small change in Cvar 220; while at other control voltage 207 levels, the same particular magnitude change in the control voltage 207 manifests a relatively large change in Cvar 220. Because the voltage-controlled capacitor is being used to control the equivalent capacitance of the LC network, and thereby the output frequency of the oscillator 210, the non-linear capacitive response 310 can effectively manifest as non-linear control of the oscillator 210. For example, at different control voltage 207 levels, the same magnitude change in control voltage 207 can yield different magnitude changes in output frequency of the LC oscillator circuit 210.

Returning to FIG. 1, such a non-linear capacitive response can yield undesirable operating conditions in some environments, such as in context of the PLL system 100. One such condition is that implementing the VCO block 130 with a non-linear capacitive response can result in the VCO block 130 manifesting a varying gain across different regions of its operating range. Another such condition is that implementing the VCO block 130 with a non-linear capacitive response can cause the PLL to manifest loop instability (or to have difficulty achieving loop stability) at certain regions of its operating range.

Embodiments include a novel implementation of voltage-controlled capacitance, referred to herein as a "staggered-bias varactor" 140. As described herein, the staggered-bias varactor 140 is designed in such a manner that seeks to achieve a substantially linear capacitance response over a relatively large operating range. It is noted that, though some implementations described herein seek to achieve improved linearity in capacitive response, it may be impossible or impracticable to achieve perfect linearity. Thus, the term "substantially linear" is used herein to describe capacitive responses of staggered-bias varactors 140 described herein, which are appreciably more linear than the types of non-linear capacitive responses seen across conventional types of voltage-controlled capacitors (e.g., as in FIGS. 2 and 3), or across component sub-varactors of the staggered-bias varactor 140 as described herein.

As illustrated, the staggered-bias varactor 140 can be implemented as part of the VCO block 130. Though not shown, the staggered-bias varactor 140 includes a number of sub-varactors, each driven with a same control voltage (i.e., Vctrl 125), but a different bias voltage 145. For example, an implementation of the staggered-bias varactor 140 having N sub-varactors can be driven by N Vbias 145 levels. The number of sub-varactors and the different levels of Vbias 145 can be designed so that each sub-varactor manifests a non-linear capacitance response, but a total capacitance of the staggered-bias varactor 140 (e.g., the equivalent capacitance of all the sub-varactors in parallel) manifests a substantially linear capacitance response.

Figure 4A:
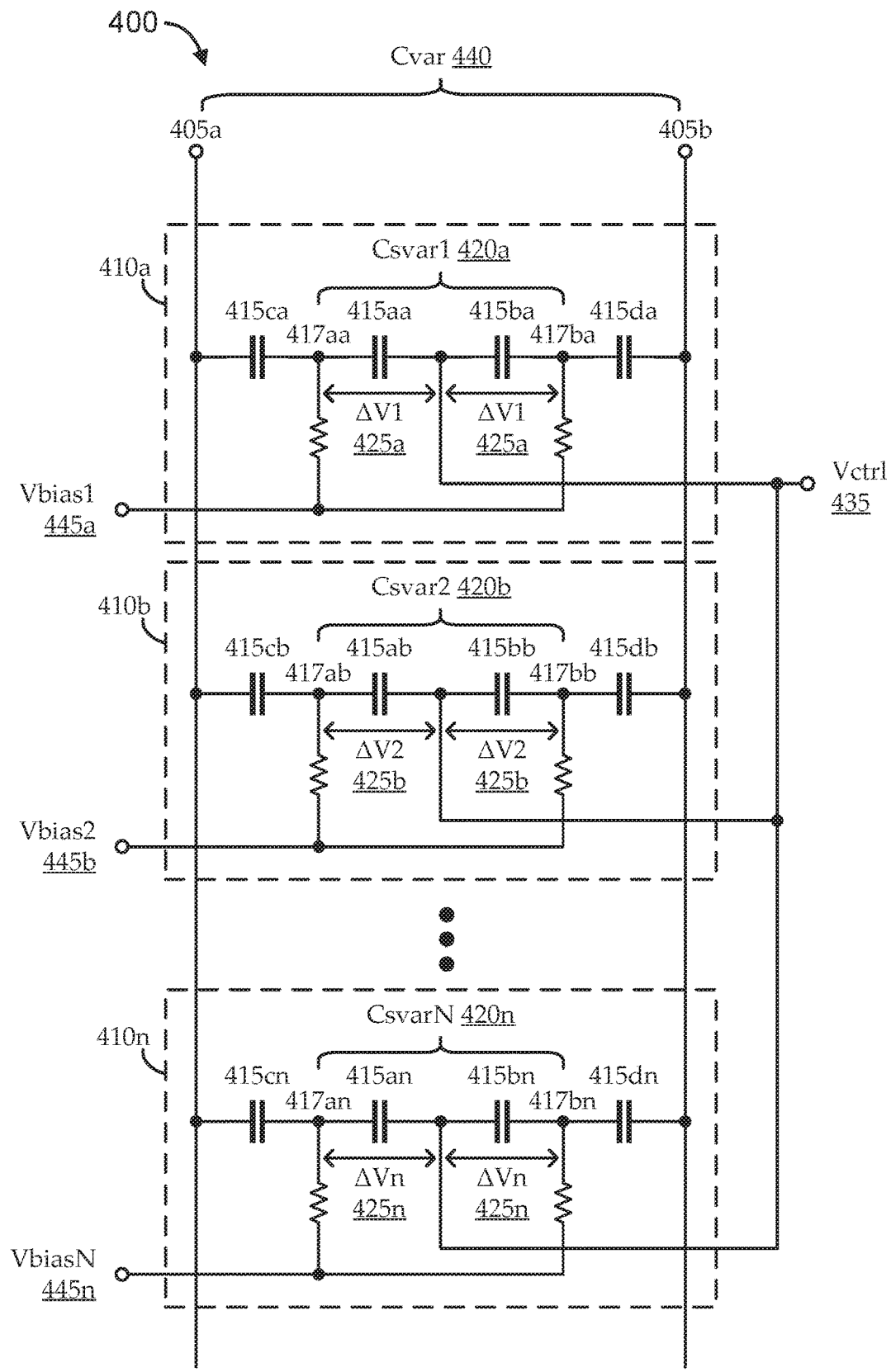
FIG. 4A shows a circuit diagram of an illustrative staggered-bias varactor, according to various embodiments.

FIG. 4A shows a circuit diagram of an illustrative staggered-bias varactor 400, according to various embodiments. The staggered-bias varactor 400 can be an implementation of the staggered-bias varactor 140 of FIG. 1. As illustrated, the staggered-bias varactor 400 includes a pair of varactor terminals 405, a control voltage node 435, and N bias voltage input nodes 445. For example, implementing the staggered-bias varactor 400 in context of FIG. 1 can involve coupling the control voltage node 435 with Vctrl 125 (e.g., at the output of the loop filter block 120), coupling each of the bias voltage input nodes 445 with a respective Vbias 145, and coupling the varactor terminals 405 with the oscillator 135.

The staggered-bias varactor 140 includes N sub-varactors 410, each coupled between the pair of varactor terminals 405. Each of the sub-varactors 410 has a variable capacitance portion coupled with the control voltage node 435 and with a respective one of the N bias voltage nodes 445. In some implementations, as illustrated, the variable capacitance portion includes a first capacitor 415a and a second capacitor 415a. Each first capacitor 415a can be coupled between a respective first bias voltage terminal 417a and the control voltage node 435, and each second capacitor 415b can be coupled between the control voltage node 435 and a respective second bias voltage terminal 417b. In each sub-varactor 410, the first and second bias voltage terminals 417 are both coupled with the respective one of the N bias voltage nodes 445. As such, a respective sub-varactor capacitance 420 of each sub-varactor (e.g., or each variable portion of each sub-varactor) varies as a function of a control voltage applied at the control voltage node 435 and a respective bias voltage applied at the respective one of the N bias voltage nodes 445.

In some implementations, in each sub-varactor 410, the first and second bias voltage terminals 417a are coupled with the respective one of the N bias voltage nodes 445 via one or more resistors. In some embodiments, in each sub-varactor 410, each first bias voltage terminal 417a can be coupled with a first one of the varactor terminals 405a via a third capacitor 415c, and/or each second bias voltage terminal 417b can be coupled with a second one of the varactor terminals 405b via a fourth capacitor 415d. Various embodiments can be implemented with any suitable relative capacitance values. In some implementations, each sub-varactors 410 is implemented substantially identically, such that all the first capacitors 415a in all the N sub-varactors 410 are nominally equivalent to each other, and all the second capacitors 415b in all the N sub-varactors 410 are nominally equivalent to each other (e.g., and/or all the third capacitors 415c in all the N sub-varactors 410 are nominally equivalent to each other, and/or all the fourth capacitors 415d in all the N sub-varactors 410 are nominally equivalent to each other). As used herein, "nominally equivalent" generally indicates that the components are intended to be equivalent (e.g., designed to have the same capacitance value), but that those components, in practice, will likely vary from their nominal values due to process variations, and the like. In other implementations, in each sub-varactor 410, all the capacitors 415 are nominally equivalent. In other implementations, in each sub-varactor 410 the first capacitor 415a and the second capacitor 415b are nominally equivalent, but have a different capacitance from that of the third capacitor 415c and/or the fourth capacitor 415d.

Figure 4B:
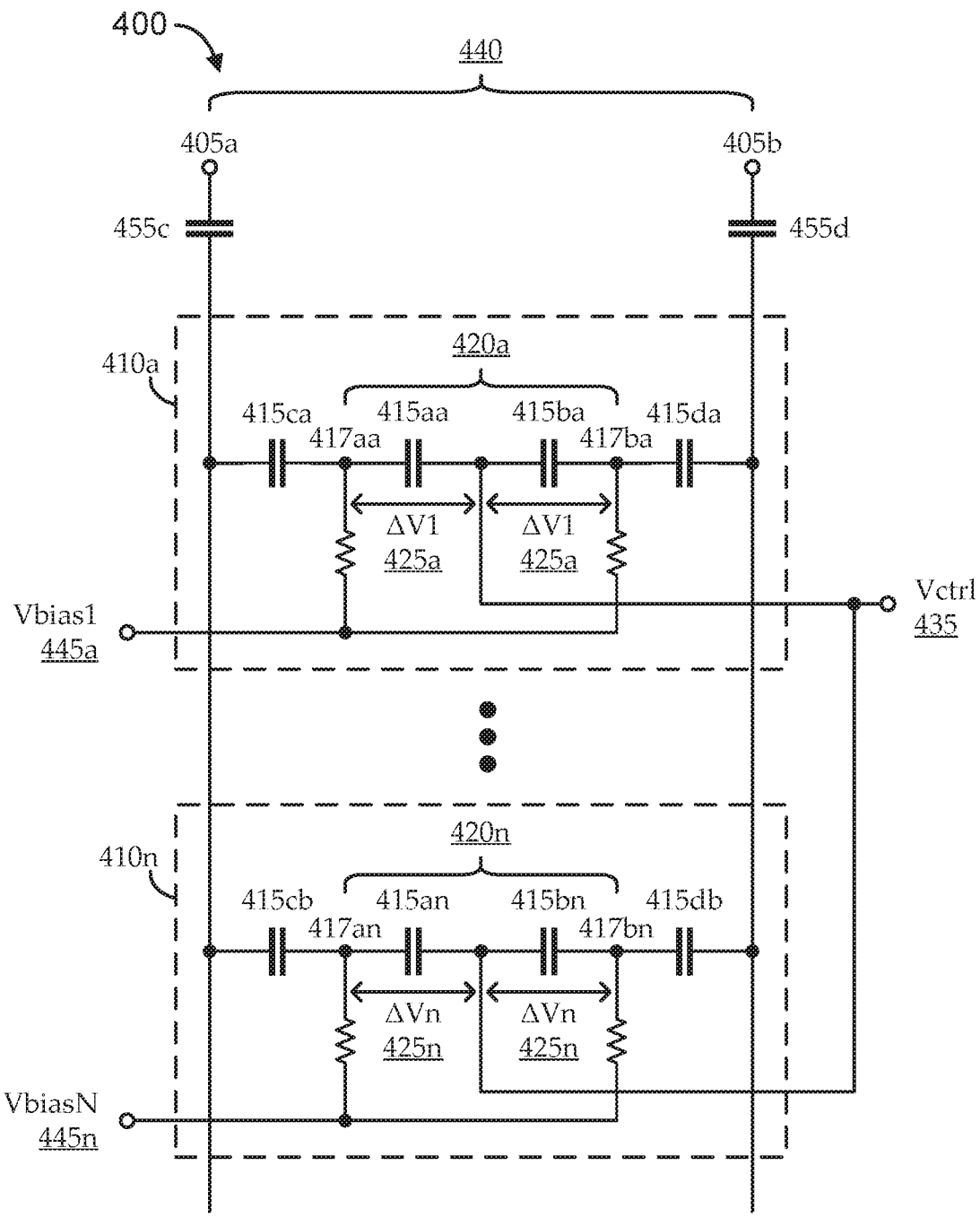
FIG. 4B shows a circuit diagram of an alternative embodiments of a staggered-bias varactor.

Other embodiments can include other configurations of resistors and/or capacitors. For example, FIG. 4B shows a circuit diagram of an alternative embodiments of a staggered-bias varactor 400. The staggered-bias varactor 400 of FIG. 4B is the same as the staggered-bias varactor 400 of FIG. 4A; except that, in addition to having respective third capacitors 415c and fourth capacitors 415d in each of the N sub-varactors 410 as in FIG. 4A, there is a single equivalent third capacitor 455c and a single equivalent fourth capacitor 455d. For example, some of the capacitive effect of respective third capacitors 415ca-415cn of FIG. 4A is implemented in FIG. 4B as an equivalent third capacitor 455c having a capacitance equivalent to a portion of the sum of the capacitances of respective third capacitors 415ca-415cn (e.g., N times the capacitance of each respective third capacitor 415c); and some of the capacitive effect of respective fourth capacitors 415da-415dn of FIG. 4A are implemented in FIG. 4B as an equivalent fourth capacitor 455d having a capacitance equivalent to a portion of the sum of the capacitances of respective fourth capacitors 415da-415dn (e.g., N times the capacitance of each respective fourth capacitor 415d). In such a configuration, all the sub-varactors 410 are coupled with the first varactor terminal 405a via the same equivalent third capacitor 455c; and all the sub-varactors 410 are coupled with the second varactor terminal 405b via the same equivalent fourth capacitor 455d.

Figure 5:
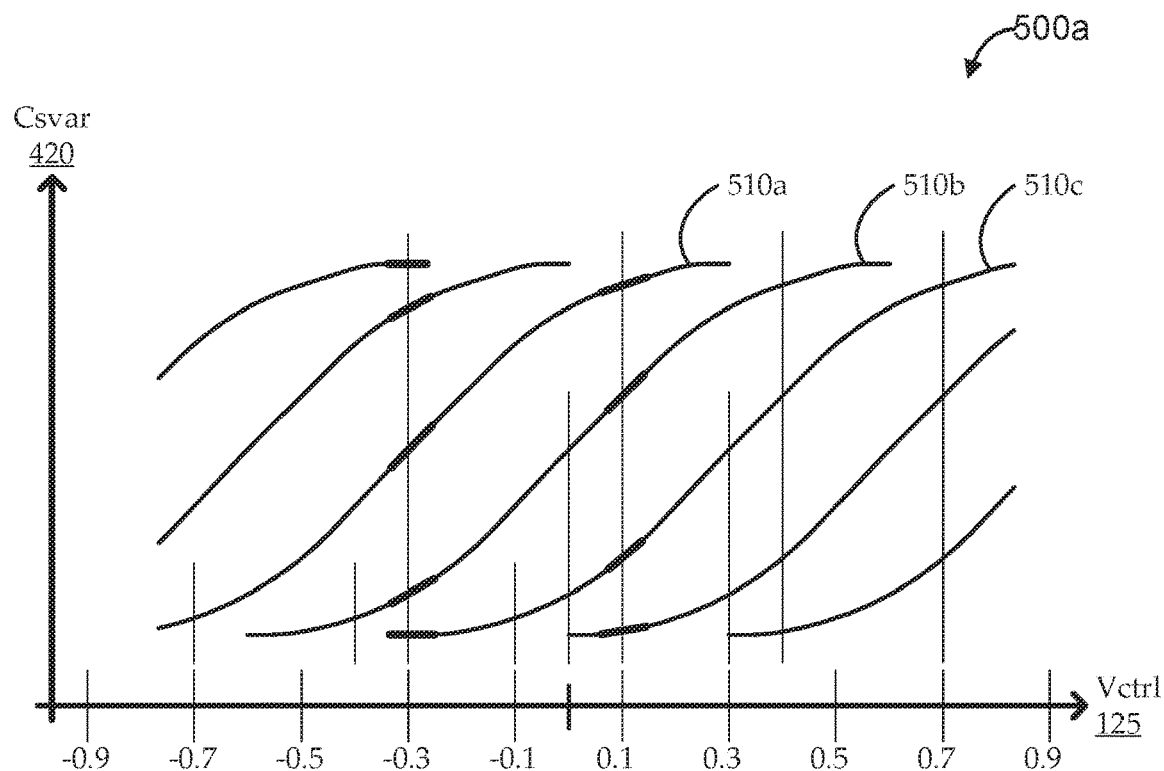
FIG. 5 shows a plot of illustrative respective capacitive responses for the sub-varactors of FIG. 4A or 4B, and a plot of a resulting illustrative overall capacitive response for the staggered-bias varactor of FIG. 4A or 4B.
Figure 5:
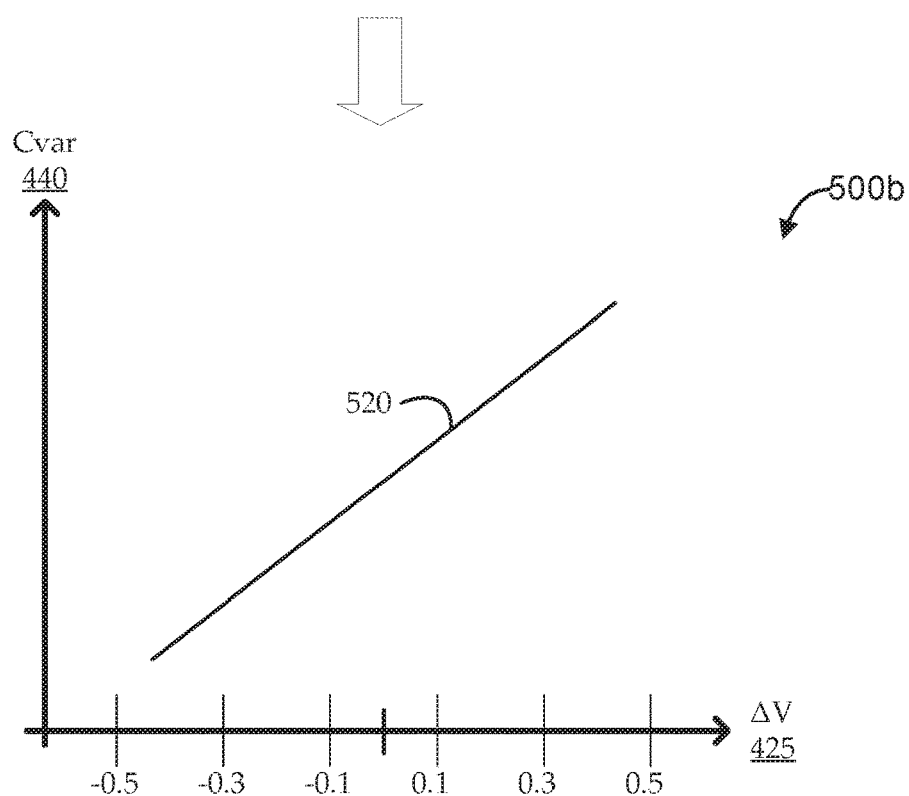

FIG. 5 shows a plot 500a of illustrative respective capacitive responses 510 for the sub-varactors 410 of FIG. 4A or 4B, and a plot 500b of a resulting illustrative overall capacitive response 520 for the staggered-bias varactor 400 of FIG. 4A or 4B. Turning first to plot 500a, each capacitive response 510 is expressed as Csvar 420 over a range of Vctrl 125 (i.e., the control voltage applied at the control voltage node 435). Each capacitive response 510 curve is associated with a different respective one of the sub-varactors 410, which is biased by a different respective bias voltage 145 (applied at the respective one of the N bias voltage nodes 445 to which the sub-varactor 410 is coupled). As shown, the capacitive response 510 of each sub-varactor 410 is non-linear, such that the slope of each capacitive response 510 curve is different at different levels of Vctrl 124. However, because each sub-varactor 410 is biased with a different bias voltage 145, the capacitive response 510 curves for the different sub-varactors 410 are shifted with respect to each other.

As an example, three of the capacitive response curves (510a, 510b, and 510c) are associated with three sub-varactors 410a, 410b, and 410c, respectively. A first bias voltage 145a of −0.3 volts is applied to the bias voltage node 445a of sub-varactor 410a, a second bias voltage 145b of 0.0 volts is applied to the bias voltage node 445b of sub-varactor 410b, and a third bias voltage 145c of 0.3 volts is applied to the bias voltage node 445c of sub-varactor 410c. When Vctrl 125 varies from −0.3 volts to 0.3 volts, ΔV 425a for sub-varactor 410a varies from 0.0 volts to 0.6 volts (ΔV=Vctrl−Vbias), ΔV 425b for sub-varactor 410b varies between −0.3 volts and 0.3 volts, and ΔV 425c for sub-varactor 410c is −0.6 volts to 0.0 volts. Thus, for example, a ΔV 425 of 0.0 volts is associated with the bottom of the range of Vctrl 125 values for sub-varactor 410a (where the slope of the respective capacitive response 510a is relatively small), with the middle of the range of Vctrl 125 values for sub-varactor 410b (where the slope of the respective capacitive response 510b is relatively large), and with the top of the range of Vctrl 125 values for sub-varactor 410c (where the slope of the respective capacitive response 510c is relatively small). Such can be seen in the plot 500a. For example, at a Vctrl 125 of −0.3, the capacitive response curve 510a for sub-varactor 410a has a relatively large slope, while the capacitive response curves 510b and 510c for sub-varactors 410b and 410c have relatively small slopes; while at a Vctrl 125 of 0.1 volts, the capacitive response curve 510a for sub-varactor 410a has a relatively small slope, while the capacitive response curves 510b and 510c for sub-varactors 410b and 410c have relatively large slopes.

Turning to plot 500b, a resulting illustrative overall capacitive response 520 is shown for the staggered-bias varactor 400 of FIG. 4A or 4B. The capacitive response 520 is expressed as Cvar 440 over a range of ΔV 425. It will be appreciated that, with the N sub-varactors 410 coupled in parallel with respect to the varactor terminals 405, the overall staggered-bias varactor 400 has an equivalent capacitance Cvar 440 related to the sum of the capacitances of the individual sub-varactors 410. For example, in the configuration of FIG. 4A, Cvar 440 is approximately equal to Csvar1 420a+Csvar2 420b++CsvarN 420n. In the configuration of FIG. 4B, Cvar 440 is approximately computed as follows:

$$\frac{1}{Cvar} = \frac{1}{C455c} + \frac{1}{C455d} + \frac{1}{Csvar1 + Csvar2 + \ldots + CsvarN}$$

where "C455c" is the capacitance of equivalent third capacitor 455c, and "C455d" is the capacitance of equivalent fourth capacitor 455d.

Thus, at any particular ΔV 425, the shape of the capacitive response 520 of the staggered-bias varactor 400 is related to the sum of the capacitive responses 510 of the component sub-varactors 410. For any particular application, a number of sub-varactors 410 and a set of bias voltages 145 can be selected, so that the sum of the slopes of the component capacitive responses 510 remains substantially constant over a range of Vctrl 125. In this way, though the respective capacitance of each sub-varactor 410 varies non-linearly as a function of Vctrl 125 as applied at the control voltage node 435 (i.e., each capacitive response 510 is non-linear), the total varactor capacitance across the N sub-varactors in parallel (i.e., Cvar 440) varies substantially linearly to as a function of Vctrl 125 as applied at the control voltage node 435 (i.e., the capacitive response 520 is substantially linear.

Figure 6:
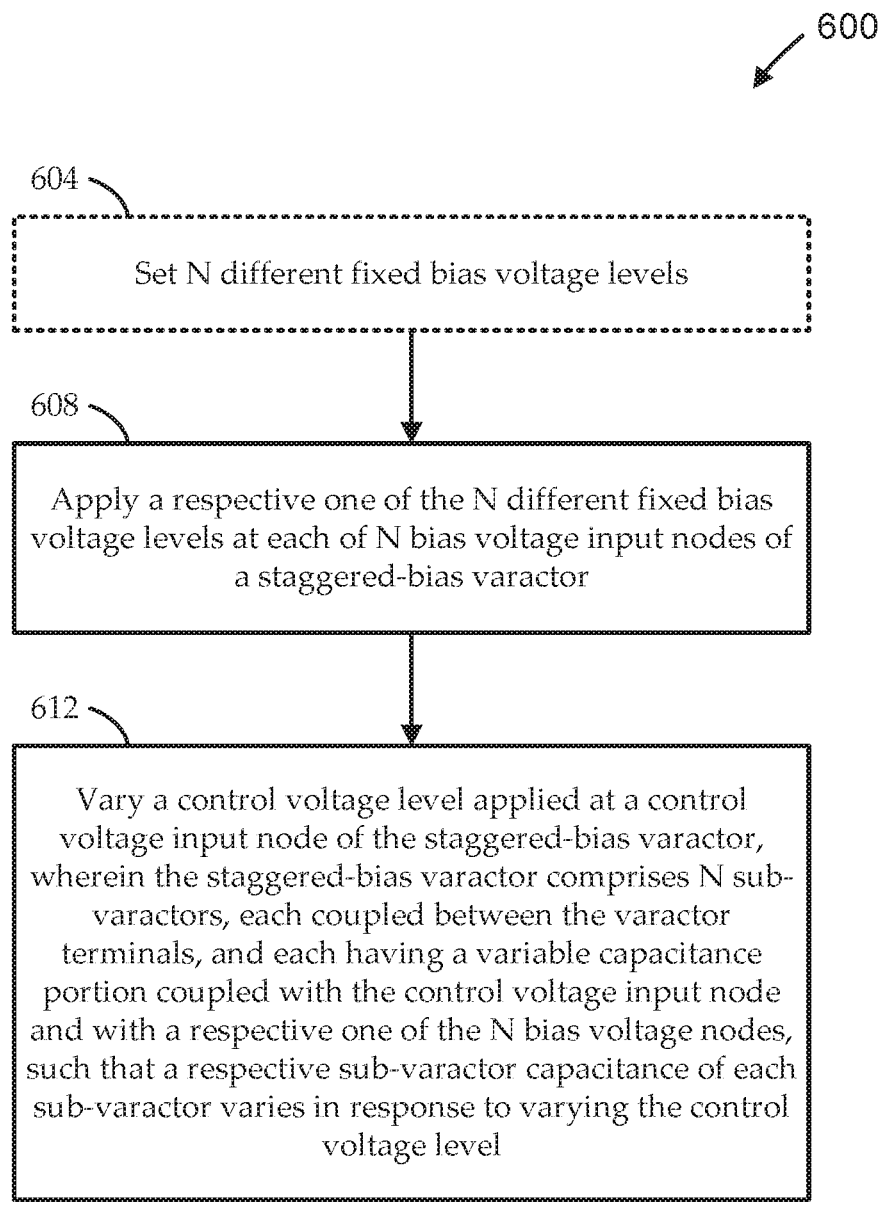
FIG. 6 shows a flow diagram of an illustrative method for controlling a total capacitance across varactor terminals of a staggered-bias varactor, according to various embodiments.

FIG. 6 shows a flow diagram of an illustrative method 600 for controlling a total capacitance across varactor terminals of a staggered-bias varactor, according to various embodiments. As described above, the staggered-bias varactor includes N sub-varactors, each coupled between the varactor terminals. N is a positive integer greater than one (i.e., two or more). Each sub-varactor has a variable capacitance portion coupled with the control voltage node and with a respective one of the N bias voltage nodes. For example, the variable capacitance portions includes a pair of capacitors coupled in parallel between the control voltage node and the respective one of the N bias voltage nodes (e.g., via a resistor).

Some implementations of the method begin at stage 604 by setting N different fixed bias voltage levels. The method 600 can either begin or continue at stage 608 by applying a respective one of the N different fixed bias voltage level at each of N bias voltage input nodes of the staggered-bias varactor. At stage 612, embodiments can vary a control voltage level applied at the control voltage node. As described above, a respective sub-varactor capacitance of each sub-varactor varies in response to varying the control voltage level. Accordingly, varying the control voltage level applied at the control voltage node at stage 612 can cause the respective sub-varactor capacitances to vary, thereby causing a total capacitance (e.g., an equivalent capacitance) across the varactor terminals to vary. As described above, with the staggered bias voltages applied at stage 608, the respective sub-varactor capacitance of each sub-varactor can vary non-linearly in response to varying the control voltage level at stage 612; and the total capacitance of the staggered-bias varactor can vary substantially linearly in response to varying the control voltage level at stage 612.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A staggered-bias varactor comprising:
a pair of varactor terminals;
a control voltage node;
N bias voltage input nodes, wherein N is a positive integer greater than one; and
N sub-varactors, each coupled between the pair of varactor terminals, and having a variable capacitance portion coupled with the control voltage node and with a respective one of the N bias voltage nodes, the variable capacitance portion comprising:
a first capacitor coupled between the respective first bias voltage terminal and a respective control voltage terminal; and
a second capacitor coupled between the respective control voltage terminal and a respective second bias voltage terminal,
wherein the first bias voltage terminal is coupled with a first of the pair of varactor terminals and with the respective one of the N bias voltage nodes, and the second bias voltage terminal is coupled with a second of the pair of varactor terminals and with the respective one of the N bias voltage nodes,
wherein, for each sub-varactor, the first capacitor and the second capacitor have a same nominal capacitance,
such that a respective sub-varactor capacitance of each sub-varactor varies as a function of a control voltage applied at the control voltage node and a different respective bias voltage applied at each respective one of the N bias voltage nodes.

2. The staggered-bias varactor of claim 1, wherein:
for each sub-varactor, the respective sub-varactor capacitance varies non-linearly as a function of the control voltage applied at the control voltage node; and
in response to applying the different respective bias voltage at each respective one of the N bias voltage nodes, a total varactor capacitance across the N sub-varactors in parallel varies substantially linearly to as a function of the control voltage.

3. The staggered-bias varactor of claim 1, wherein the first bias voltage terminal is coupled with the first of the pair of varactor terminals via a third capacitor.

4. The staggered-bias varactor of claim 1, wherein the second bias voltage terminal is coupled with the second of the pair of varactor terminals via a fourth capacitor.

5. The staggered-bias varactor of claim 1, wherein the respective first bias voltage terminal and the respective second bias voltage terminal are each coupled with the respective one of the N bias voltage nodes via a respective resistor.

6. A method for controlling a total capacitance across varactor terminals of a staggered-bias varactor, the method comprising:
applying a respective one of N different fixed bias voltage levels at each of N bias voltage input nodes of the staggered-bias varactor, wherein N is a positive integer greater than one; and
varying a control voltage level applied at a control voltage node,
wherein the staggered-bias varactor comprises N sub-varactors, each coupled between the varactor terminals, and each having a variable capacitance portion coupled with the control voltage node and with a respective one of the N bias voltage nodes,
the variable capacitance portion comprising:
a first capacitor coupled between the respective first bias voltage terminal and a respective control voltage terminal; and
a second capacitor coupled between the respective control voltage terminal and a respective second bias voltage terminal,
wherein the first bias voltage terminal is coupled with a first of the pair of varactor terminals and with the respective one of the N bias voltage nodes, and the second bias voltage terminal is coupled with a second of the pair of varactor terminals and with the respective one of the N bias voltage nodes,
wherein, for each sub-varactor, the first capacitor and the second capacitor have a same nominal capacitance,
such that a respective sub-varactor capacitance of each sub-varactor varies in response to varying the control voltage level.

7. The method of claim 6, further comprising:
setting the N different fixed bias voltage levels, such that, in response to applying the respective one of the N different fixed bias voltage level at each of the N bias voltage input nodes:
the respective sub-varactor capacitance of each sub-varactor varies non-linearly in response to varying the control voltage level; and
the total capacitance of the staggered-bias varactor varies substantially linearly in response to varying the control voltage level, the total capacitance of the staggered-bias varactor being a capacitance across the N sub-varactors in parallel.

8. An oscillator system comprising:
a capacitor-controlled oscillator to generate an output signal at an oscillator frequency; and
a varactor having varactor terminals coupled with the capacitor-controlled oscillator, the varactor comprising:
a control voltage node;
N bias voltage input nodes, wherein N is a positive integer greater than one; and
N sub-varactors, each coupled between the varactor terminals, and having a variable capacitance portion coupled with the control voltage node and with a respective one of the N bias voltage nodes, the variable capacitance portion comprising:
- a first capacitor coupled between the respective first bias voltage terminal and a respective control voltage terminal; and
- a second capacitor coupled between the respective control voltage terminal and a respective second bias voltage terminal,
- wherein the first bias voltage terminal is coupled with a first of the pair of varactor terminals and with the respective one of the N bias voltage nodes, and the second bias voltage terminal is coupled with a second of the pair of varactor terminals and with the respective one of the N bias voltage nodes,
- wherein, for each sub-varactor, the first capacitor and the second capacitor have a same nominal capacitance,
- such that a respective sub-varactor capacitance of each sub-varactor varies as a function of a control voltage applied at the control voltage node and a respective bias voltage applied at the respective one of the N bias voltage nodes, and
- such that the oscillator frequency is a function of a total capacitance of the N respective sub-varactor capacitances in parallel.

9. The oscillator system of claim 8, wherein the capacitor-controlled oscillator is an inductive-capacitive (LC) oscillator, wherein a resonant frequency of the LC oscillator is responsive to the total capacitance of the N respective sub-varactor capacitances in parallel.

10. The oscillator system of claim 8, wherein the capacitor-controlled oscillator is a ring oscillator, wherein a ring delay is responsive to the total capacitance of the N respective sub-varactor capacitances in parallel.

11. The oscillator system of claim 8, further comprising:
a phase-locked loop (PLL) comprising a voltage-controlled oscillator (VCO), a PLL output frequency of the PLL being controlled by the VCO, the VCO comprising the capacitor-controlled oscillator and the varactor.

12. The oscillator system of claim 8, wherein:
a different respective bias voltage is applied at each respective one of the N bias voltage nodes.

13. The oscillator system of claim 12, wherein:
for each sub-varactor, the respective sub-varactor capacitance varies non-linearly as a function of the control voltage applied at the control voltage node; and
in response to applying the different respective bias voltage at each respective one of the N bias voltage nodes, the total capacitance of the N respective sub-varactor capacitances in parallel varies substantially linearly to as a function of the control voltage.

14. The oscillator system of claim 8, wherein, for each sub-varactor:
the first respective bias voltage terminal is coupled with the first of the pair of varactor terminals via a third capacitor; and
the second respective bias voltage terminal is coupled with the second of the pair of varactor terminals via a fourth capacitor.

15. The oscillator system of claim 8, wherein, for each sub-varactor:
each of the first respective bias voltage terminal and the second respective bias voltage terminal is coupled with the respective one of the N bias voltage nodes via a respective resistor.

* * * * *